(12) United States Patent
Kumagai et al.

(10) Patent No.: US 7,125,812 B2
(45) Date of Patent: Oct. 24, 2006

(54) CVD METHOD AND DEVICE FOR FORMING SILICON-CONTAINING INSULATION FILM

(75) Inventors: Takeshi Kumagai, Tokyo (JP); Hitoshi Katoh, Tokyo (JP); Jinsu Lee, Tokyo (JP); Shingo Maku, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 15 days.

(21) Appl. No.: 10/500,150

(22) PCT Filed: Jan. 14, 2003

(86) PCT No.: PCT/JP03/00206

§ 371 (c)(1), (2), (4) Date: Jul. 12, 2004

(87) PCT Pub. No.: WO03/060978

PCT Pub. Date: Jul. 24, 2003

(65) Prior Publication Data

US 2005/0095770 A1    May 5, 2005

(30) Foreign Application Priority Data

Jan. 15, 2002   (JP) .............................. 2002-005827

(51) Int. Cl.
*H01L 21/31*   (2006.01)
(52) U.S. Cl. ................. 438/778; 438/786; 438/787
(58) Field of Classification Search .................. None
See application file for complete search history.

(56) References Cited

U.S. PATENT DOCUMENTS

| | | | |
|---|---|---|---|
| 6,245,690 B1 * | 6/2001 | Yau et al. ................... 438/780 |
| 6,333,547 B1 | 12/2001 | Tanaka et al. | |
| 6,436,824 B1 * | 8/2002 | Chooi et al. ................. 438/687 |
| 6,537,733 B1 * | 3/2003 | Campana et al. ........... 430/313 |
| 6,541,367 B1 * | 4/2003 | Mandal ....................... 438/622 |
| 6,583,069 B1 * | 6/2003 | Vassiliev et al. ............ 438/778 |
| 6,593,247 B1 * | 7/2003 | Huang et al. ................ 438/758 |
| 6,656,371 B1 * | 12/2003 | Drewes ........................ 216/22 |
| 6,733,830 B1 * | 5/2004 | Todd ...................... 427/255.28 |
| 6,764,958 B1 * | 7/2004 | Nemani et al. ............. 438/758 |
| 6,787,397 B1 * | 9/2004 | Swanson et al. ............ 438/118 |

FOREIGN PATENT DOCUMENTS

| | | |
|---|---|---|
| EP | 1 172 846 | 1/2002 |
| JP | 8-227888 | 9/1996 |

* cited by examiner

*Primary Examiner*—Thao P. Le
(74) *Attorney, Agent, or Firm*—Oblon, Spivak, McClelland, Maier & Neustadt, P.C.

(57) ABSTRACT

A CVD apparatus (2) forms an insulating film, which is a silicon oxide film, silicon nitride film, or silicon oxynitride film. The CVD apparatus includes a process chamber (8) to accommodate a target substrate (W), a support member (20) to support the target substrate in the process chamber, a heater (12) to heat the target substrate supported by the support member, an exhaust section (39) to vacuum-exhaust the process chamber, and a supply section (40) to supply a gas into the process chamber. The supply section includes a first circuit (42) to supply a first gas of a silane family gas, a second circuit (44) to supply a second gas, which is an oxidizing gas, nitriding gas, or oxynitriding gas, and a third circuit (46) to supply a third gas of a carbon hydride gas, and can supply the first, second, and third gases together.

10 Claims, 6 Drawing Sheets

CVD METHOD AND DEVICE FOR FORMING SILICON-CONTAINING INSULATION FILM

TECHNICAL FIELD

The present invention relates to a CVD method and apparatus for forming a silicon-containing insulating film on a target substrate.

BACKGROUND ART

Semiconductor devices include insulating films made of $SiO_2$, PSG (Phospho Silicate Glass), P-SiO ("P" stands for formation by plasma CVD), P-SiN ("P" stands for formation by plasma CVD), SOG (Spin On Glass), $Si_3N_4$ (silicon nitride), etc. As a method of forming such a silicon oxide film or silicon nitride film on the surface of a semiconductor wafer, there is known a method of forming a film by thermal CVD (Chemical Vapor Deposition), which employs a silane family gas, such as monosilane ($SiH_4$), dichlorosilane (DCS: $SiH_2Cl_2$), hexa-chlorodisilane (HCD: $Si_2Cl_6$), bistertialbutylamino-silane (BTBAS: $SiH_2(NH(C_4H_9)_2)$, as a silicon source gas.

Specifically, for example, where a silicon oxide film is deposited, the thermal CVD for forming the silicon oxide film is performed, using a gas combination, such as $SiH_4+N_2O$, $SiH_2Cl_2+N_2O$, or TEOS (tetraethyl-orthosilicate)$+O_2$. Where a silicon nitride film is deposited, the thermal CVD for forming the silicon nitride film is performed, using a gas combination, such as $SiH_2Cl_2+NH_3$, or $Si_2Cl_6+NH_3$.

Owing to the demands of increased miniaturization and integration of semiconductor devices, insulating films such as those described above need to be made thinner. Furthermore, in order to maintain the electric properties of the various films that lay below insulating films, the temperature used in thermal CVD in forming the insulating films needs to be lowered. In this respect, for example, where a silicon nitride film is deposited, thermal CVD for forming the silicon nitiride film is conventionally performed at a high temperature of about 760° C. In recent years, thermal CVD for forming the silicon nitiride film is performed at a lower temperature of about 600° C., as the case may be.

When semiconductor devices are fabricated, a conductive film and an insulating film as described above are stacked and pattern-etched to form a multi-layer structure. Where an insulating film is formed and another thin film is then formed thereon, contaminants such as organic substances and particles may have stuck to the surface of the insulating film. In order to remove the contaminants, a cleaning process is performed, as needed. In this case, the semiconductor wafer is immersed in a cleaning solution, such as dilute hydrofluoric acid, to etch the surface of the insulating film. By doing so, the surface of the insulating film is etched by a very small amount, thereby removing the contaminants.

Where an insulating film is formed by CVD at a high temperature of, e.g., about 760° C., the etching rate of the insulating film during cleaning is very small. Accordingly, the insulating film is not excessively etched by cleaning, and thus the cleaning process is performed with a high controllability in the film thickness. On the other hand, where an insulating film is formed by CVD at a low temperature of, e.g., about 600° C., the etching rate of the insulating film during cleaning is relatively large. Accordingly, the insulating film may be excessively etched by cleaning, and thus the cleaning process entails less controllability in the film thickness.

DISCLOSURE OF INVENTION

An object of the present invention is to provide a method and apparatus for forming a silicon-containing insulating film, which allows the etching rate of the film during cleaning to be relatively small even if the film has been formed at a relatively low temperature, thereby improving the controllability in the film thickness during cleaning.

According to a first aspect of the present invention, there is provided a CVD method of forming a silicon-containing insulating film, comprising:

supplying a film-formation gas into a process chamber that accommodates a target substrate, while exhausting an interior of the process chamber, thereby forming the insulating film on the target substrate by deposition, wherein a carbon hydride gas is supplied together with the film-formation gas.

According to a second aspect of the present invention, there is provided a CVD method of forming an insulating film, consisting essentially of a film selected from the group consisting of a silicon oxide film, silicon nitride film, and silicon oxynitride film, the method comprising:

supplying first, second, and third gases into a process chamber that accommodates a target substrate, while heating and exhausting an interior of the process chamber, thereby forming the insulating film on the target substrate by deposition, wherein the first gas consists essentially of a silane family gas, a second gas consists essentially of a gas selected from the group consisting of an oxidizing gas, nitriding gas, and oxynitriding gas, the third gas consists essentially of a carbon hydride gas, and a flow rate ratio of the third gas relative to the first gas is set to fall within a range of from 10 to 100.

According to a third aspect of the present invention, there is provided a CVD apparatus for forming an insulating film, consisting essentially of a film selected from the group consisting of a silicon oxide film, silicon nitride film, and silicon oxynitride film, the apparatus comprising:

a process chamber configured to accommodate a target substrate;

a support member configured to support the target substrate in the process chamber;

a heater configured to heat the target substrate supported by the support member;

an exhaust section configured to vacuum-exhaust an interior of the process chamber; and a supply section configured to supply a gas into the process chamber, wherein the supply section comprises a first circuit configured to supply a first gas consisting essentially of a silane family gas, a second circuit configured to supply a second gas consisting essentially of a gas selected from the group consisting of an oxidizing gas, nitriding gas, and oxynitriding gas, and a third circuit configured to supply a third gas consisting essentially of a carbon hydride gas, and is capable of supplying the first, second, and third gases at the same time.

BEST MODE FOR CARRYING OUT THE INVENTION

In the process of developing the present invention, the inventors studied etching rates of silicon-containing insulating films, such as a silicon oxide film, silicon nitride film, and silicon oxynitride film, during cleaning. As a result, the inventors have arrived at the finding that the etching rates during cleaning are reduced if the insulating films are prepared to positively contain carbon components.

Embodiments of the present invention will now be described with reference to the accompanying drawings. In the following description, the constituent elements having substantially the same function and arrangement are denoted by the same reference numerals, and a repetitive description will be made only when necessary.

<First Embodiment>

Figure 1:
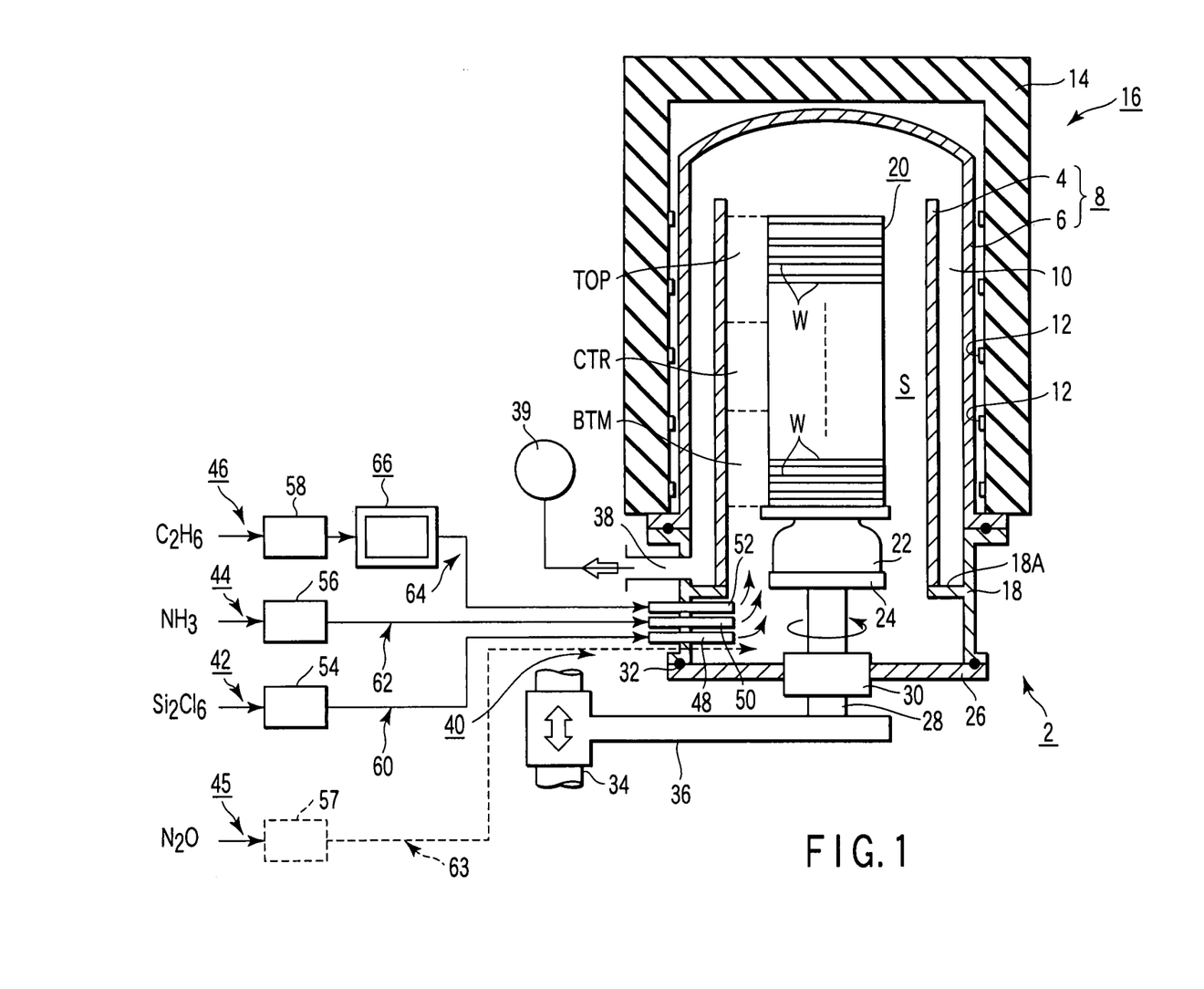
FIG. 1 is a sectional view showing a CVD apparatus according to a first embodiment of the present invention.

FIG. 1 is a sectional view showing a CVD apparatus according to a first embodiment of the present invention. The CVD apparatus 2 is arranged to supply a first gas consisting essentially of a silane family gas (silicon source gas), a second gas consisting essentially of a gas selected from the group consisting of an oxidizing gas, nitriding gas, and oxynitriding gas, and a third gas consisting essentially of a carbon hydride gas, at the same time, so as to form an insulating film consisting essentially of a film selected from the group consisting of a silicon oxide film, silicon nitride film, and silicon oxynitride film. For example, where $Si_2Cl_6$ and $NH_3$ gases are used to deposit a silicon nitride film, a carbon hydride gas is supplied to cause carbon components to be contained in the film.

As shown in FIG. 1, the CVD apparatus 2 includes a process chamber 8 having a double tube structure, which is formed of a cylindrical inner tube 4 made of quartz, and an outer tube 6 made of quartz and disposed concentrically with the inner tube 4 with a predetermined gap 10 therebetween.

The process chamber 8 is surrounded by a heating cover 16, which includes a heater or heating means 12 and a thermal insulator 14. The heating means 12 is disposed over the entire inner surface of the thermal insulator 14. In this embodiment, the inner tube 4 of the process chamber 8 has an inner diameter of about 240 mm, and a height of about 1300 mm. The process chamber 8 has a volume of about 110 liters.

The bottom of the process chamber 8 is supported by a cylindrical manifold 18 made of, e.g., stainless steel. A ring support plate 18A extends inward from the inner wall of the manifold 18 and supports the bottom of the inner tube 4. A number of target substrates or semiconductor wafers W are stacked on a wafer boat 20 made of quartz. The wafer boat 20 is loaded/unloaded into and from the process chamber 8 through the bottom of the manifold 18. In this embodiment, the wafer boat 20 can support 150 product wafers having a diameter of 200 mm and 13 or 20 dummy wafers at substantially regular intervals in the vertical direction. In other words, the wafer boat 20 can accommodate 170 wafers in total.

The wafer boat 20 is placed on a rotary table 24 through a heat-insulating cylinder 22 made of quartz. The rotary table 24 is supported by a rotary shaft 28, which penetrates a lid 26 used for opening/closing the bottom port of the manifold 18. The portion of the lid 26 where the rotary shaft 28 penetrates is provided with, e.g., a magnetic-fluid seal 30, so that the rotary shaft 28 is rotatably supported in an airtightly sealed state. A seal member 32, such as an O-ring is interposed between the periphery of the lid 26 and the bottom of the manifold 18, so that the interior of the process chamber 8 can be kept sealed.

The rotary shaft 28 is attached at the distal end of an arm 36 supported by an elevating mechanism 34, such as a boat elevator. The elevating mechanism 34 moves up and down the wafer boat 20 and lid 26 integratedly. An exhaust port 38 is formed in the side of the manifold 18 to exhaust the atmosphere in the process chamber 8 through the bottom of the gap 10 between the inner tube 4 and outer tube 6. The exhaust port 38 is connected to a vacuum exhaust section 39 including a vacuum pump and so forth.

A gas supply section 40 is connected to the side of the manifold 18 to supply predetermined process gases into the inner tube 4. More specifically, the gas supply section 40 includes a silane family gas circuit 42, an oxidizing and/or nitriding gas circuit 44, and a carbon hydride gas circuit 46. The gas circuits 42, 44, and 46 respectively include linear gas nozzles 48, 50, and 52, which penetrate the sidewall of the manifold 18.

The gas nozzles 48, 50, and 52 are respectively connected to gas passages 60, 62, and 64 provided with flow rate controllers 54, 56, and 58, such as mass-flow controllers. The gas passages 60, 62, and 64 are arranged to respectively supply a silane family gas, an oxidizing and/or nitriding gas, and a carbon hydride gas at controlled flow rates. For example, the silane family gas (silicon source gas) is hexachlorodisilane ($Si_2Cl_6$) gas, the nitriding gas is $NH_3$ gas, and the carbon hydride gas is ethane ($C_2H_6$) gas. $N_2O$ gas or $O_2$ gas may be used as an oxidizing gas.

The carbon hydride gas passage 64 is provided with a pre-heating unit 66. For example, the pre-heating unit 66 is formed of a quartz container wound with a heater outside and filled with quartz grains. The pre-heating unit 6 pre-heats a carbon hydride gas, such as ethane gas, flowing therethrough, to a predetermined temperature. As a consequence, the ethane gas flowing through the pre-heating unit 66 is activated.

Next, an explanation will be given of a CVD method according to an embodiment of the present invention, performed in the apparatus described above.

At first, when the CVD apparatus is in a waiting state with no wafers loaded therein, the interior of the process chamber 8 is kept at a process temperature of, e.g., about 500° C. On the other hand, a number of wafers, e.g. 150 product wafers W and 20 dummy wafers, are transferred into the wafer boat 20. After the wafers are transferred, the wafer boat 20, which is at a normal temperature, is moved up from below the process chamber 8 and loaded into the process chamber 8. Then, the lid 26 closes the bottom port of the manifold 18 to airtightly seal the interior of the process chamber 8.

Then, the interior of the process chamber 8 is vacuum exhausted to a predetermined process pressure of, e.g., about 27 Pa. The wafer temperature is increased to a process temperature for film formation of, e.g., about 600° C. After the temperature becomes stable, $Si_2Cl_6$ gas used as a silane family gas, $NH_3$ gas used as a nitriding gas, and $C_2H_6$ gas used as a carbon hydride gas are supplied from the respective nozzles 48, 50, and 52 of the gas supply section 40 at controlled flow rates, in accordance with a predetermined manner.

The $C_2H_6$ gas is heated to a predetermined temperature of, e.g., from 500 to 1000° C. in the pre-heating unit 66, which is disposed on the carbon hydride gas passage 64 immediately before the nozzle 52, so that it is activated immediately before the supply. The $C_2H_6$ gas, however, may be supplied without pre-heating. The $C_2H_6$ gas thus activated by pre-heating, or with no pre-heating, is supplied into the bottom of the process chamber 8 and mixed with the $Si_2Cl_6$ gas and $NH_3$ gas. The gases thus mixed react with each other while flowing upward in the process space S, and cause a silicon nitride thin film to be deposited on the surface of each wafer W. The process gases thus flowing upward in the process space S bounce off the ceiling of the process chamber 8, and flow through the gap 10 between the inner tube 4 and outer tube 6, and then are exhausted through the exhaust port 38.

The lower limit of the heating temperature of $C_2H_6$ gas in the pre-heating unit 66 is set at about 500° C. The upper limit of the pre-heating is not restricted, but it is preferably set at a temperature at which the etching rate of a silicon nitride film becomes saturated, as described later, at about 1000° C. for example. The upper limit of the $C_2H_6$ gas flow rate is not restricted, but it is preferably set at a flow rate at which the etching rate of a silicon nitride film becomes saturated, as described later, at about 200 sccm for example. In this embodiment, the $Si_2Cl_6$ gas flow rate is set at about 30 sccm, and the $NH_3$ gas flow rate is set at about 900 sccm.

As described above, $C_2H_6$ gas is supplied into the process chamber 8, and carbon components are thereby contained in a silicon nitride film formed on a wafer surface. This brings about a low etching rate of the silicon nitride film surface relative to the dilute hydrofluoric acid used in a cleaning process, even though the film-formation temperature is lower than the conventional film-formation temperature of, e.g., about 760° C. As a consequence, it is possible to prevent the silicon nitride film from being excessively etched during the cleaning process, thereby improving the controllability in the film thickness.

Particularly, the pre-heating of $C_2H_6$ gas activates this gas and causes more carbon components to be contained in the silicon nitride film by that much. As a consequence, the etching rate of the silicon nitride film is reduced still further. In this case, as described later, the carbon component concentration in the silicon nitride film can be controlled to attain a predetermined etching rate.

Next, an explanation will be given of experiments conducted using the CVD apparatus 2 shown in FIG. 1. In these experiments, a process was performed in a state corresponding to conditions with 150 product wafers and 20 dummy wafers placed on the wafer boat 20. As shown also in FIG. 1, the process chamber 8 (and wafer boat 20) was divided in terms of wafer position into three zones in the vertical direction, i.e., TOP (top), CTR (center), and BTM (bottom). From the top of the wafer boat 20, 1st to 60th wafers belonged to the top zone, 61st to 111th wafers belonged to the center zone, and 112th to 170th wafers belonged to the bottom zone.

Etching rate values obtained by the experiments were converted into comparative values relative to a reference value "1", and were used as normalized etching rates. The reference value "1" was set to be the etching rate of a silicon nitride film, which was formed at a process temperature of 760° C. (conventional film-formation temperature), using dichlorosilane ($SiH_2Cl_2$) gas and $NH_3$ gas, without any carbon hydride gas.

[Experiment 1]

An experiment was conducted to examine the relationship between the $C_2H_6$ gas flow rate and the carbon component concentration in a silicon nitride film. This experiment employed the following conditions as constants, i.e., a process temperature of 600° C., process pressure of 27 Pa, $Si_2Cl_6$ gas flow rate of 30 sccm, $NH_3$ gas flow rate of 900 sccm, and $C_2H_6$ gas pre-heating temperature of 1000° C. On the other hand, this experiment employed different $C_2H_6$ gas flow rates falling within a range of from 0 to 200 sccm.

Figure 2:
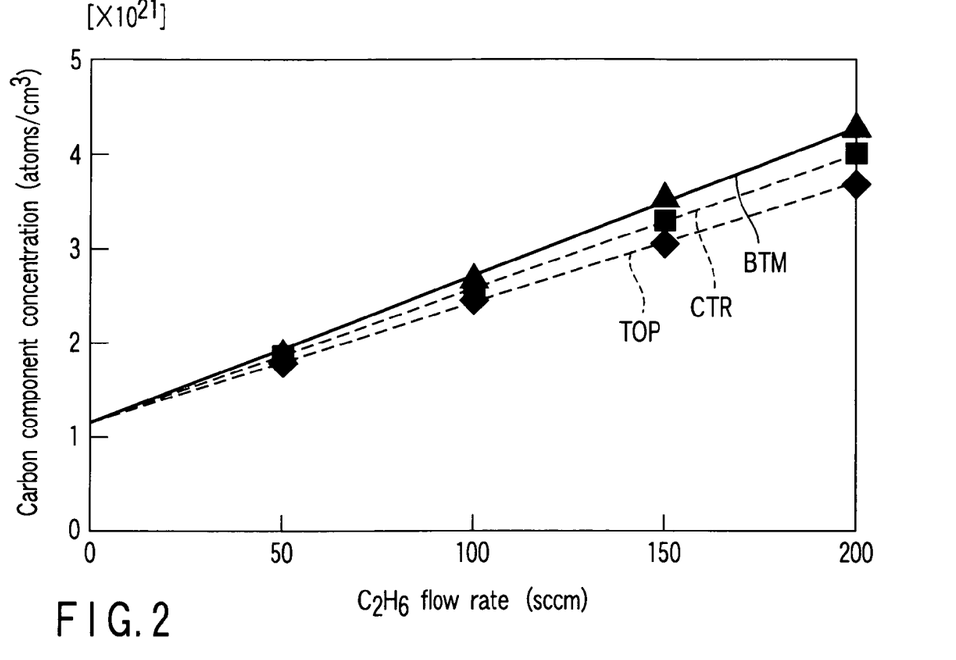
FIG. 2 is a graph obtained by experiment 1 and showing the relationship between the $C_2H_6$ gas flow rate and the carbon component concentration in a silicon nitride film.

FIG. 2 is a graph obtained by experiment 1 and showing the relationship between the $C_2H_6$ gas flow rate and the carbon component concentration in a silicon nitride film.

As shown in FIG. 2, the carbon component concentration in a silicon nitride film almost linearly increased with increase in the $C_2H_6$ gas flow rate within a range of from 0 to 200 sccm, without reference to the wafer positions from the top to bottom. Accordingly, it has been found that the carbon component concentration in a silicon nitride film increases as the $C_2H_6$ gas flow rate increases.

[Experiment 2]

An experiment was conducted to examine the relationship between the $C_2H_6$ gas pre-heating temperature and the carbon component concentration in a silicon nitride film. This experiment employed the following conditions as constants, i.e., a process temperature of 600° C., process pressure of 27 Pa, $Si_2Cl_6$ gas flow rate of 30 sccm, $NH_3$ gas flow rate of 900 sccm, and $C_2H_6$ gas flow rate of 200 sccm. On the other hand, this experiment employed different $C_2H_6$ gas pre-heating temperatures within a range of from 500 to 1000° C.

Figure 3:
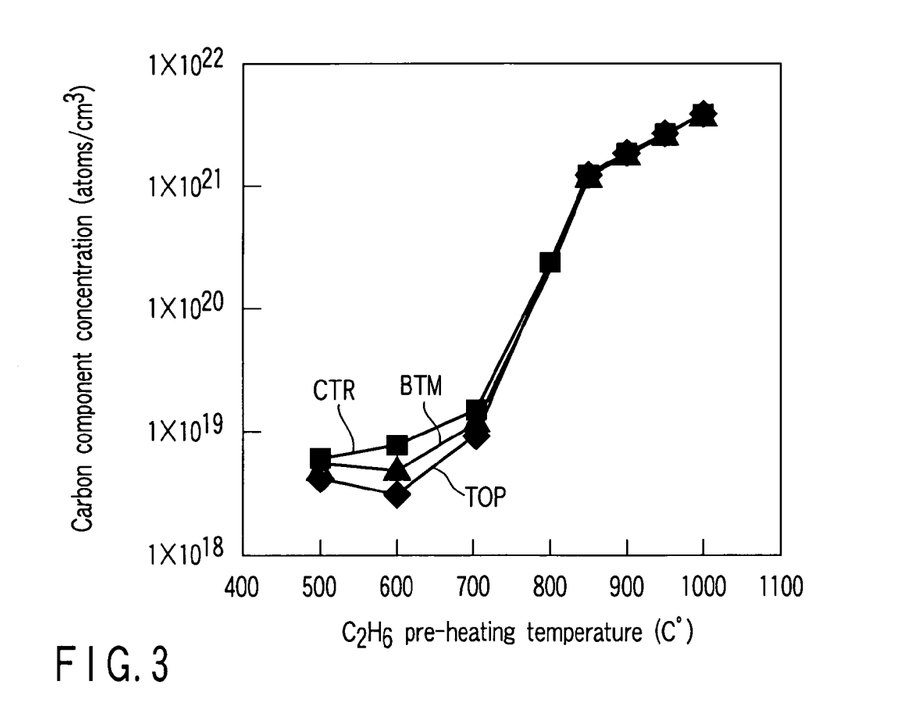
FIG. 3 is a graph obtained by experiment 2 and showing the relationship between the $C_2H_6$ gas pre-heating temperature and the carbon component concentration in a silicon nitride film.

FIG. 3 is a graph obtained by experiment 2 and showing the relationship between the $C_2H_6$ gas pre-heating temperature and the carbon component concentration in a silicon nitride film.

As shown in FIG. 3, where the $C_2H_6$ gas pre-heating temperature was within a range of from 500 to 700° C., the carbon content concentration in a silicon nitride film gradually increased in principle, although there was a partly downward trend, which seems to be in the range of error. Where the pre-heating temperature was within a range of from 700 to 900° C., the carbon content concentration drastically increased with increase in the temperature. Where the pre-heating temperature was within a range of from 900 to 1000° C., the carbon content concentration gradually increased with increase in the temperature, to be almost saturated. Accordingly, it has been found that, where the $C_2H_6$ gas pre-heating is performed, the carbon component concentration increases as the temperature increases.

In this case, in order to increase the carbon component concentration in a silicon nitride film to a certain extent or more, it is preferable to pre-heat the $C_2H_6$ to a temperature of about 500° C. or more. Since the carbon component concentration is almost saturated at about 1000° C., the upper limit of pre-heating is preferably set at about 1000° C.

[Experiment 3]

With reference to the results of experiments 1 and 2, an experiment was conducted to examine the relationship between the carbon component concentration in a silicon nitride film and the etching rate thereof relative to dilute hydrofluoric acid. This experiment employed the following conditions as constants, i.e., a process temperature of 600° C., process pressure of 27 Pa, $Si_2Cl_6$ gas flow rate of 30 sccm, $NH_3$ gas flow rate of 900 sccm, and $C_2H_6$ gas flow rate of 200 sccm. On the other hand, this experiment employed different pre-heating temperatures to vary the carbon component concentration in a silicon nitride film within a range of from $1 \times 10^{18}$ to $1 \times 10^{22}$ atms/cm$^3$.

Figure 4:
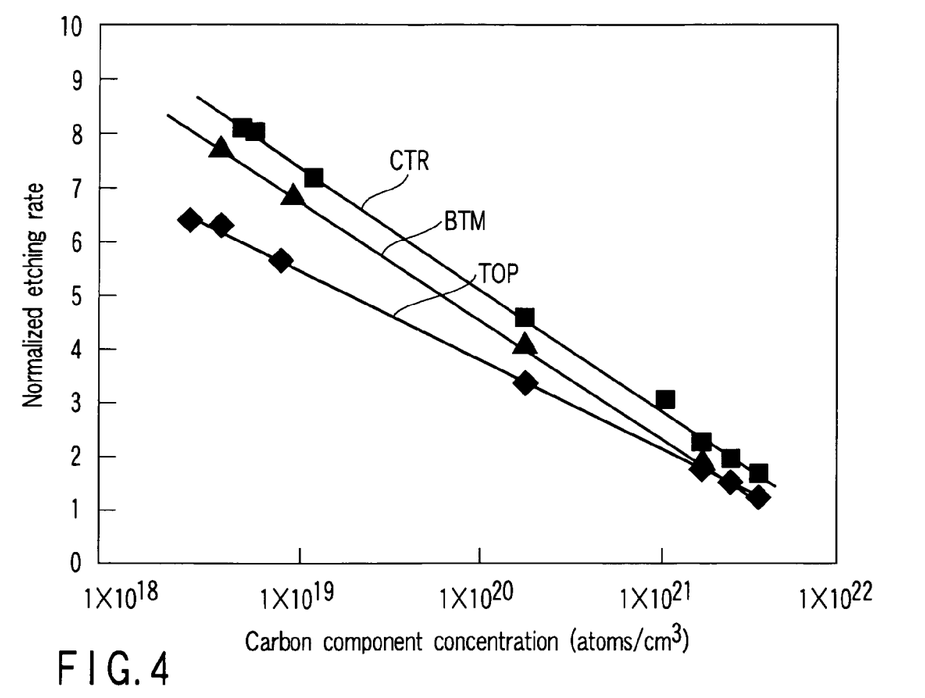
FIG. 4 is a graph obtained by experiment 3 and showing the relationship between the carbon component concentration in a silicon nitride film and the normalized etching rate thereof relative to dilute hydrofluoric acid (49%-HF: $H_2O$=1:100)

FIG. 4 is a graph obtained by experiment 3 and showing the relationship between the carbon component concentration in a silicon nitride film and the normalized etching rate thereof relative to dilute hydrofluoric acid (49%-HF:$H_2O$=1:100).

A shown in FIG. 4, the etching rate linearly decreased with increase in the carbon component concentration in a silicon nitride film within a range of from $1 \times 10^{18}$ to $1 \times 10^{22}$ atms/cm$^3$, without reference to the wafer positions from the top to bottom. Accordingly, it has been found that the normalized etching rate can be controlled by adjusting the carbon content concentration. Particularly, where the carbon content concentration was $1 \times 10^{22}$ atms/cm$^3$, the normalized etching rate was about "1". It means that a film formed at a process temperature as low as 600° C. showed almost the same etching rate as conventional silicon nitride film formed at 760° C.

[Experiment 4]

In order to supplement the result of experiment 3, an experiment was conducted to examine the relationship between the $C_2H_6$ gas pre-heating temperature and the etching rate of a silicon nitride film relative to dilute hydrofluoric acid. This experiment employed the following conditions as constants, i.e., a process temperature of 600° C., process pressure of 27 Pa, $Si_2Cl_6$ gas flow rate of 30 sccm, $NH_3$ gas flow rate of 900 sccm, and $C_2H_6$ gas flow rate of 200 sccm. On the other hand, this experiment employed different $C_2H_6$ gas pre-heating temperatures within a range of from 500 to 1000° C.

Figure 5:
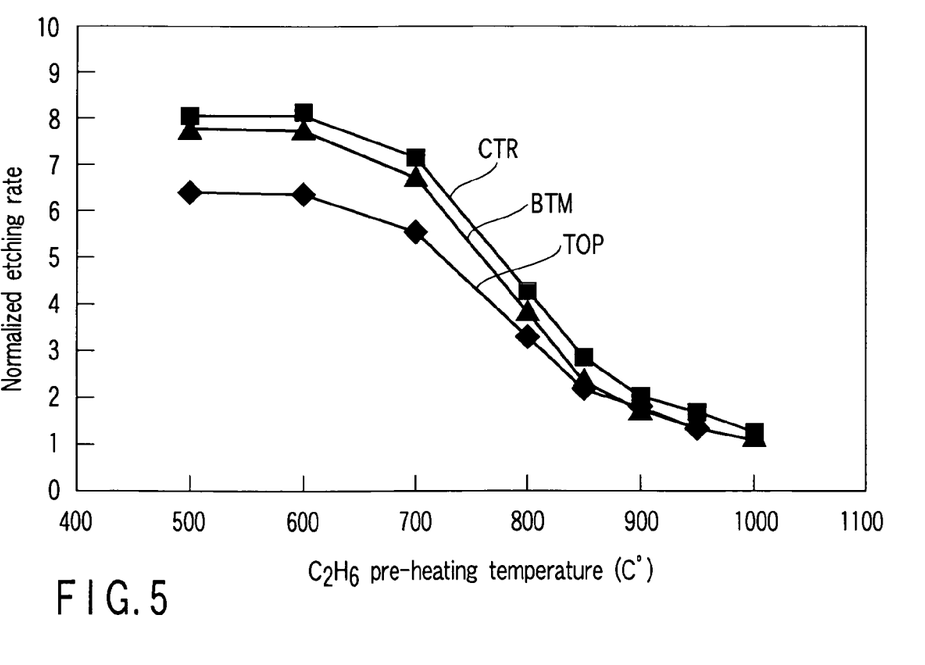
FIG. 5 is a graph obtained by experiment 4 and showing the relationship between the $C_2H_6$ gas pre-heating temperature and the normalized etching rate of a silicon nitride film relative to dilute hydrofluoric acid (49%-HF:$H_2O$=1:100)

FIG. 5 is a graph obtained by experiment 4 and showing the relationship between the $C_2H_6$ gas pre-heating temperature and the normalized etching rate of a silicon nitride film relative to dilute hydrofluoric acid (49%-HF:$H_2O$=1:100).

A shown in FIG. 5, the normalized etching rate gradually decreased with increase in the pre-heating temperature within a range of from 500 to 700° C., without reference to the wafer positions from the top to bottom. Where the pre-heating temperature was within a range of from 700 to 900° C., the normalized etching rate sharply decreased with increase in the temperature. Where the pre-heating temperature was within a range of from 900 to 1000° C., the normalized etching rate gradually decreased again with increase in the temperature. Where the pre-heating temperature was at about 1000° C., the normalized etching rate was about "1" and the decrease was saturated. Accordingly, it has been found that the normalized etching rate can be arbitrarily set at a vale within a range of from about 1 to 8, by adjusting the $C_2H_6$ gas pre-heating temperature within a range of from 500 to 1000° C.

[Experiment 5]

In order to supplement the result of experiment 3, an experiment was conducted to examine the relationship between the $C_2H_6$ gas flow rate (with/without pre-heating) and the etching rate of a silicon nitride film relative to dilute hydrofluoric acid. This experiment employed the following conditions as constants, i.e., a process temperature of 600° C., process pressure of 27 Pa, $Si_2Cl_6$ gas flow rate of 30 sccm, and $NH_3$ gas flow rate of 900 sccm. On the other hand, this experiment employed different $C_2H_6$ gas flow rates within a range of from 0 to 200 sccm. Furthermore, at each selected flow rate, two kinds of conditions were set, i.e., without $C_2H_6$ pre-heating (normal temperature) and with pre-heating at 1000° C.

Figure 6:
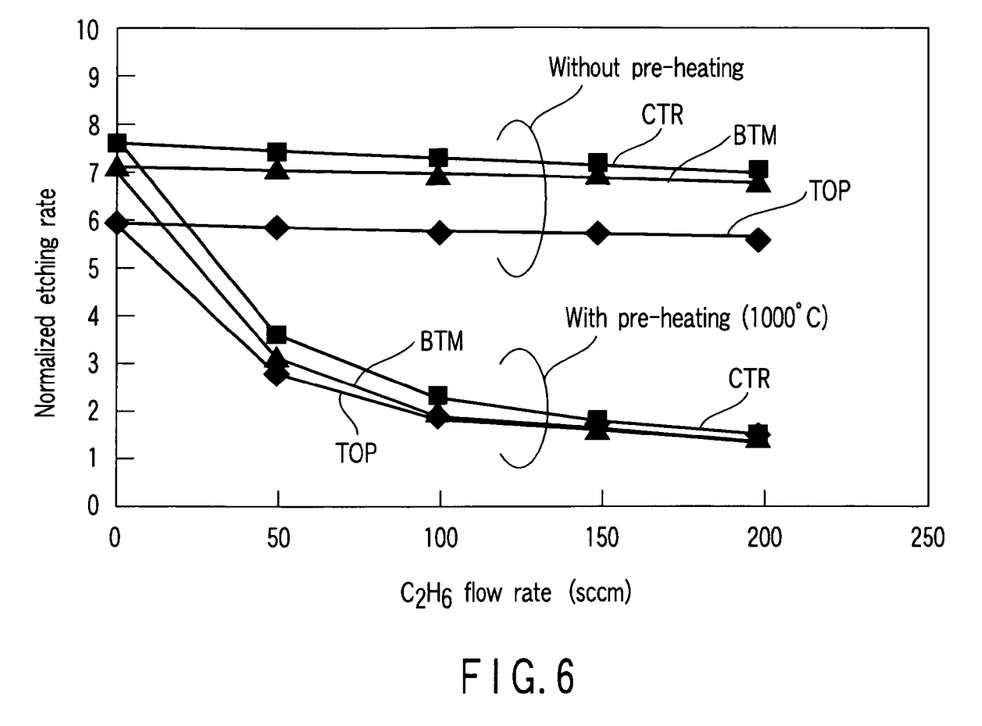
FIG. 6 is a graph obtained by experiment 5 and showing the relationship between the $C_2H_6$ gas flow rate (with/without pre-heating) and the normalized etching rate of a silicon nitride film relative to dilute hydrofluoric acid (49%-HF:$H_2O$=1:100)

FIG. 6 is a graph obtained by experiment 5 and showing the relationship between the $C_2H_6$ gas flow rate (with/without pre-heating) and the normalized etching rate of a silicon nitride film relative to dilute hydrofluoric acid (49%-HF:$H_2O$=1:100).

A shown in FIG. 6, in a case where the $C_2H_6$ gas was supplied at a normal temperature without pre-heating, the normalized etching rate decreased only slightly from "6 to 7.5" to "5.5 to 7.0" with increase in the $C_2H_6$ gas flow rate within a range of from 0 to 200 sccm, without reference to the wafer positions from the top to bottom. Accordingly, it has been found that, where no pre-heating is performed, the etching rate tends to decrease with increase in the $C_2H_6$ gas flow rate, but the degree of the decrease is very small.

On the other hand, in a case where the $C_2H_6$ gas was pre-heated at 1000° C., the normalized etching rate remarkably changed with increase in the $C_2H_6$ gas flow rate within a range of from 0 to 200 sccm, without reference to the wafer positions from the top to bottom. Specifically, where the $C_2H_6$ gas flow rate was within a range of from 0 to 100 sccm, the normalized etching rate sharply decreased from "6 to 8" to about "2". Where the flow rate was within a range of from 100 to 200 sccm, the normalized etching rate gradually decreased with increase in the flow rate. Where the flow rate was at 200 sccm, the etching rate was about "1" and the decrease was saturated. Accordingly, it has been found that the normalized etching rate can be arbitrarily set at a vale within a range of from about 1 to 8, by adjusting the $C_2H_6$ gas flow rate within a range of from 0 to 200 sccm, while maintaining the $C_2H_6$ gas pre-heating temperature at 1000° C.

<Second Embodiment>

In the first embodiment described above, ethane ($C_2H_6$), which belongs to the paraffin series carbon hydrides, is used as a carbon hydride gas. Instead, another paraffin series carbon hydride, such as methane, propane, or butane, may be used as a carbon hydride gas. Furthermore, in place of a paraffin series carbon hydride, an acetylene series carbon hydride, such as acetylene or ethylene, may be used.

Figure 7:
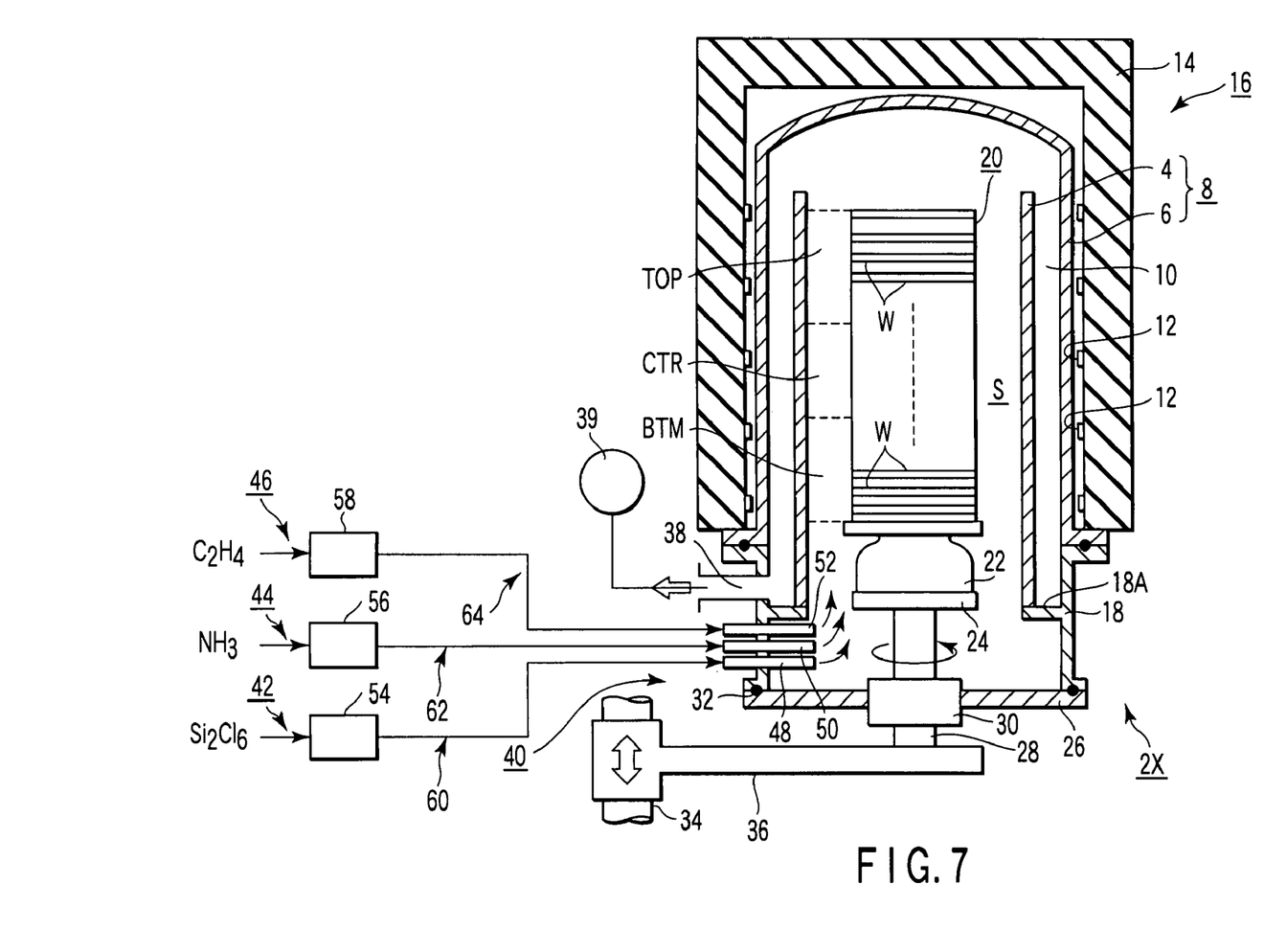
FIG. 7 is a sectional view showing a CVD apparatus according to a second embodiment of the present invention.

In the second embodiment, ethylene ($C_2H_4$) gas is used as a carbon hydride gas. Using ethylene gas as a carbon hydride gas is advantageous in that, even where it is supplied into the process chamber 8 without pre-heating, the same effect as described above can be obtained, i.e., a silicon-containing film showing a sufficiently small etching rate can be formed.

Also in this case, ethylene gas may be pre-heated.

FIG. 7 is a sectional view showing a CVD apparatus according to a second embodiment of the present invention. The CVD apparatus 2X show in FIG. 7 differs from the CVD apparatus 2 shown in FIG. 1, in that a gas supply section 40 includes a carbon hydride gas circuit 46, which is connected to an ethylene ($C_2H_4$) gas source and is provided with no pre-heating unit 66. The other parts of the CVD apparatus 2X show in FIG. 7 are basically the same as those of the CVD apparatus 2 shown in FIG. 1.

Specifically, in the CVD apparatus 2X according to the second embodiment, hexachlorodisilane ($Si_2Cl_6$) gas is used as a silane family gas (silicon source gas), $NH_3$ gas is used as a nitriding gas, and ethylene ($C_2H_4$) gas is used as a carbon hydride gas. The ethylene gas used as a carbon hydride gas is fed into the process chamber 8 at about a room temperature without pre-heating.

Where a silicon nitride film is formed in the CVD apparatus 2X according to the second embodiment, carbon components can be sufficiently contained in the silicon nitride film, even though the ethylene is not pre-heated. This allows the etching rate of the film during cleaning to be relatively small even if the film has been formed at a relatively low temperature, thereby improving the controllability in the film thickness during cleaning. The reason why pre-heating is unnecessary where ethylene gas is used as a carbon hydride gas is thought to be that the bond dissociation energy (about 63 kcal/mol) of C=C (double bond) in ethylene is smaller than the bond dissociation energy (about 83 kcal/mol) of C—C in ethane, and thus ethylene has a higher reactivity (the difference is about 20 kcal/mol).

Next, an explanation will be given of experiments conducted using the CVD apparatus 2X shown in FIG. 7. Also in these experiments, a process was performed in a state corresponding to conditions with 150 product wafers and 20 dummy wafers placed on the wafer boat 20. As shown also in FIG. 7, the process chamber 8 (and wafer boat 20) was divided in terms of wafer position into three zones in the vertical direction, i.e., TOP (top), CTR (center), and BTM (bottom). From the top of the wafer boat 20, 1st to 60th wafers belonged to the top zone, 61st to 111th wafers belonged to the center zone, and 112th to 170th wafers belonged to the bottom zone.

Etching rate values obtained by the experiments were converted into comparative values relative to a reference value "1", and were used as normalized etching rates. The reference value "1" was set to be the etching rate of a silicon nitride film, which was formed at a process temperature of 760° C. (conventional film-formation temperature), using dichlorosilane ($SiH_2Cl_2$) gas and $NH_3$ gas, without any carbon hydride gas.

[Experiment 6]

An experiment was conducted to examine the effect in a case where ethylene ($C_2H_4$) gas was used in place of ethane ($C_2H_6$) gas, as a carbon hydride gas. This experiment employed the following conditions as constants, i.e., a process temperature of 600° C., process pressure of 27 Pa, $Si_2Cl_6$ gas flow rate of 30 sccm, and $NH_3$ gas flow rate of 900 sccm. On the other hand, this experiment employed different $C_2H_4$ gas flow rates falling within a range of from 0 to 150 sccm.

Figure 8:
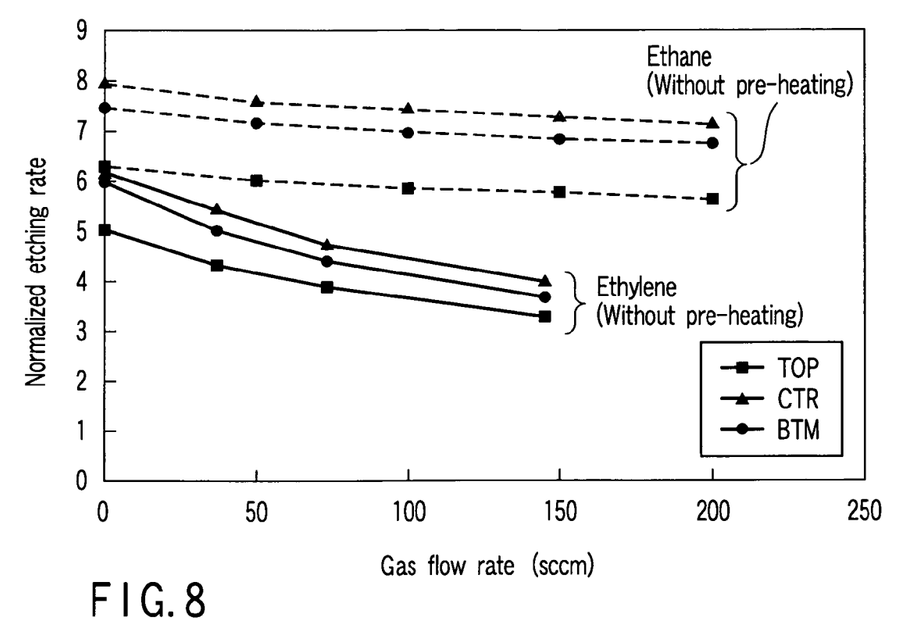
FIG. 8 is a graph obtained by experiment 6 and showing the relationship between the carbon hydride gas flow rate and the normalized etching rate of a silicon nitride film relative to dilute hydrofluoric acid (49%-HF:$H_2O$=1:100)

FIG. 8 is a graph obtained by experiment 6 and showing the relationship between the carbon hydride gas flow rate and the normalized etching rate of a silicon nitride film relative to dilute hydrofluoric acid (49%-HF:$H_2O$=1:100). This graph also includes the result where ethane was used without pre-heating, for comparison.

As shown in FIG. 8, where ethane ($C_2H_6$) was used without pre-heating, the normalized etching rate did not become smaller than a range of from about 6 to 8, with increase in the gas flow rate within a range of from 0 to 150 sccm, although the were some differences depending on the wafer positions from the top to bottom. In other words, the normalized etching rate in this case was almost constant or only slightly decreased with increase in the gas flow rate.

On the other hand, where ethylene was used as a carbon hydride gas without pre-heating, the normalized etching rate decreased from about "5 to 6" to about "3.2 to 4" with increase in the gas flow rate within a range of from 0 to 150 sccm, in all the wafer positions from the top to bottom.

[Experiment 7]

Furthermore, an experiment was conducted to examine the relationship between the ethylene ($C_2H_4$) gas flow rate and the etching rate of a silicon nitride film relative to dilute hydrofluoric acid. This experiment employed the following conditions as constants, i.e., a process temperature of 600° C., process pressure of 27 Pa, $Si_2Cl_6$ gas flow rate of 30 sccm, and $NH_3$ gas flow rate of 900 sccm. On the other hand, this experiment employed different $C_2H_4$ gas flow rates within a range of from 0 to 900 sccm.

Figure 9:
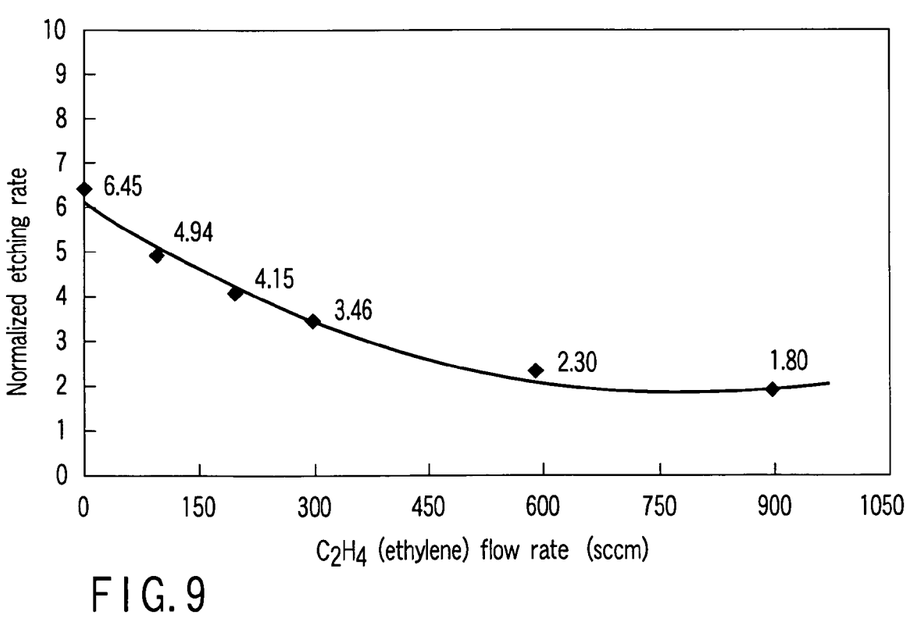
FIG. 9 is a graph obtained by experiment 7 and showing the relationship between the ethylene gas flow rate and the normalized etching rate of a silicon nitride film relative to dilute hydrofluoric acid (49%-HF:$H_2O$=1:100).

FIG. 9 is a graph obtained by experiment 7 and showing the relationship between the ethylene gas flow rate and the normalized etching rate of a silicon nitride film relative to dilute hydrofluoric acid (49%-HF:$H_2O$=1:100). This graph shows the etching rate by means of average values among the wafer positions from the top to bottom A shown in FIG. 9, the normalized etching rate gradually decreased from about 6.45 to about 1.80 with increase in the ethylene gas flow rate within a range of from 0 to 900 sccm. The decrease in the normalized etching rate was almost saturated where the ethylene gas flow rate was near 900 sccm.

Judging from the results of experiments 6 and 7, it has been found that, where ethylene is used as a carbon hydride gas even without pre-heating, the etching rate of a silicon nitride film can be sufficiently low (i.e., carbon components are sufficiently contained in the silicon nitride film).

[Experiment 8]

In order to supplement the results of experiments 6 and 7, an experiment was conducted, employing the same conditions as experiment 6 (i.e., without pre-heating), except a process temperature of 450° C., and ethylene gas flow rate of 300 sccm. As a consequence, it has been found that the normalized etching rate decreases to about a half, compared to the case where no ethylene gas is supplied.

The first and second embodiments have been explained such that a carbon hydride gas and film-formation gases (a combination of a first gas consisting essentially of a silane family gas (silicon source gas), with a second gas selected from the group consisting of an oxidizing gas, nitriding gas, and oxynitriding gas) are supplied into the process chamber 8 separately from each other though different routes. However, a carbon hydride gas may be supplied while being mixed into one of film-formation gases ($Si_2Cl_6$ gas or $NH_3$ gas).

In any case, the flow rate ratio of a carbon hydride gas relative to film-formation gases is set to fall within a range of from 0.3 to 3.2, preferably of from 0.4 to 2.8. The flow rate ratio of a carbon hydride gas relative to a silane family gas is set to fall within a range of from 10 to 100, preferably of from 15 to 85. Where the flow rate ratio of a carbon hydride gas is lower than the range described above, the etching rate of a silicon-containing insulating film becomes too high. In this case, the insulating film is excessively etched during cleaning, thereby deteriorating the controllability in the film thickness. On the other hand, where the flow rate ratio of a carbon hydride gas is higher than the range described above, the etching rate of a silicon-containing insulating film becomes too low, which is not practical.

The first and second embodiments have also been explained in the case of hexachlorodisilane (HCD: $Si_2Cl_6$) and $NH_3$ being used to form a silicon nitride film, wherein a carbon hydride gas is supplied at the same time. However, also in the case of another process gas being used to form a silicon nitride film, supply of a carbon hydride gas together therewith brings about the same effect as described above. An example of another process gas for forming a silicon nitride film is a combination of one of dichlorosilane (DCS: $SiH_2Cl_2$), tetrachlorosilane ($SiCl_4$), bistertialbutylaminosilane (BTBAS: $SiH_2(NH(C_4H_9)_2)$, and hexaethylaminodisilane (HEAD), which belong to the silane family gases (silicon source gas), with $NH_3$, which belong to the nitriding gases.

Furthermore, in the case of a silicon oxide film being formed by thermal CVD instead of a silicon nitride film, supply of a carbon hydride gas together therewith brings about the same effect as described above. An example of a process gas for forming a silicon oxide film by thermal CVD is a combination of monosilane ($SiH_4$) with $N_2O$, a combination of dichlorosilane (DCS: $SiH_2Cl_2$) with $N_2O$, a combination of TEOS (tetraethylorthosilicate) with $O_2$, or a combination of hexachlorodisilane (HCD:$Si_2Cl_6$) with $N_2O$. In this case, $N_2O$ gas or $O_2$ gas described above is used as an oxidizing gas.

Furthermore, in the case of a silicon oxynitride film being formed, supply of a carbon hydride gas together with a film-formation gas brings about the same effect as described above. An example of a process gas for forming a silicon oxynitride film by thermal CVD is a combination of dichlorosilane (DCS: $SiH_2Cl_2$) with $N_2O$ and $NH_3$. In this case, as indicated with a broken line in FIG. 1, the CVD apparatus is preferably provided with an $N_2O$ gas circuit 45 (in FIG. 1, reference characters 57 and 63 denote a flow rate controller and a gas passage, respectively) as an oxynitriding gas circuit, in addition to the $NH_3$ gas circuit 44, so that $N_2O$ and $NH_3$ are individually supplied into the process chamber 8.

The above embodiments have also been explained in the case of the CVD apparatus being formed of a batch type vertical apparatus. The present invention, however, may be applied to a batch type lateral apparatus, or a single-substrate type CVD apparatus in which target substrates are processed one by one. As regards a target substrate, the present invention may be applied to a glass substrate or LCD substrate other than a semiconductor wafer.

A CVD method and apparatus for forming a silicon-containing insulating film according to the embodiments provides the following advantages. Specifically, a carbon hydride gas is supplied together during film-formation of a silicon-containing insulating film to cause carbon components to be contained in the film. This allows the etching rate of the silicon-containing insulating film during cleaning to be relatively small even if the film has been formed at a relatively low temperature, thereby improving the controllability in the film thickness during cleaning. In addition, the carbon hydride gas thus supplied may be pre-heated and activated to cause more carbon components to be contained in the silicon-containing insulating film.

The invention claimed is:

1. A thermal CVD method of forming an insulating film, consisting essentially of a film selected from the group consisting of a silicon oxide film, silicon nitride film, and silicon oxynitride film, the method comprising:
   supplying first, second, and third gases into a process chamber that accommodates a target substrate, while heating an interior of the process chamber at a process temperature and exhausting the interior of the process chamber, thereby forming the insulating film on the target substrate by deposition,
   wherein the first gas consists essentially of a silane family gas selected from the group consisting of hexachlorodisilane, hexaethylaminodisilane, bistertialbutylaminosilane, and dichlorosilane,
   the second gas consists essentially of a gas selected from the group consisting of an oxidizing gas, nitriding gas, and oxynitriding gas,
   the third gas consists essentially of ethylene, and is supplied into the process chamber without pre-heating, and
   the process temperature is set to fall within a range of from 450 to 600° C.

2. The method according to claim 1, comprising simultaneously processing a plurality of target substrates stacked with a gap therebetween in the process chamber.

3. The method according to claim 1, wherein a flow rate ratio of the third gas relative to the first gas is set to fall within a range of from 10 to 100.

4. The method according to claim 3, wherein a flow rate ratio of the third gas relative to the first gas is set to fall within a range of from 15 to 85.

5. The method according to claim 3, wherein a flow rate ratio of the third gas relative to a total of the first and second gases is set to fall within a range of from 0.3 to 3.2.

6. The method according to claim 5, wherein a flow rate ratio of the third gas relative to a total of the first and second gases is set to fall within a range of from 0.4 to 2.8.

7. The method according to claim 1, wherein the second gas consists essentially of a nitriding gas.

8. The method according to claim 7, wherein the nitriding gas consists essentially of $NH_3$.

9. The method according to claim 1, wherein the first gas consists essentially of hexachlorodisilane.

10. A thermal CVD method of forming an insulating film consisting essentially of a silicon nitride film simultaneously on a plurality of target substrates stacked with a gap therebetween in a process chamber, the method comprising:
    supplying first, second, and third gases into the process chamber that accommodates the target substrates, while heating an interior of the process chamber at a process temperature and exhausting the interior of the process chamber, thereby forming the insulating film on the target substrates by deposition,
    wherein the first gas consists essentially of a silane family gas selected from the group consisting of hexachlorodisilane, hexaethylaminodisilane, bistertialbutylaminosilane, and dichlorosilane,
    the second gas consists essentially of a nitriding gas,
    the third gas consists essentially of ethylene, and is supplied into the process chamber without pre-heating,
    the process temperature is set to fall within a range of from 450 to 600° C.,
    a flow rate ratio of the third gas relative to the first gas is set to fall within a range of from 10 to 100, and
    a flow rate ratio of the third gas relative to a total of the first and second gases is set to fall within a range of from 0.3 to 3.2.

* * * * *